United States Patent [19]
Zettler

[11] Patent Number: 6,115,286
[45] Date of Patent: Sep. 5, 2000

[54] DATA MEMORY

[75] Inventor: Thomas Zettler, München, Germany

[73] Assignee: Siemens Aktiengesellschaft, Munich, Germany

[21] Appl. No.: 09/392,767

[22] Filed: Sep. 7, 1999

Related U.S. Application Data

[63] Continuation of application No. PCT/DE98/00274, Jan. 30, 1998.

[30] Foreign Application Priority Data

Mar. 5, 1997 [DE] Germany .................. 197 08 965

[51] Int. Cl.[7] .................................................. G11C 16/06
[52] U.S. Cl. .............................. 365/185.09; 365/185.23; 365/200
[58] Field of Search ................... 365/185.09, 185.23, 365/185.29, 185.33, 200, 230.06, 185.18

[56] References Cited

U.S. PATENT DOCUMENTS

| | | | |
|---|---|---|---|
| 4,376,300 | 3/1983 | Tsang ........................ | 365/200 |
| 4,862,416 | 8/1989 | Takeuchi .................. | 365/200 |
| 5,200,922 | 4/1993 | Rao ........................... | 365/200 |
| 5,357,463 | 10/1994 | Kinney ..................... | 365/185 |
| 5,544,106 | 8/1996 | Koike ....................... | 365/200 |
| 5,699,306 | 12/1997 | Lee et al. ................. | 365/200 |
| 5,798,973 | 8/1998 | Isa ............................. | 365/200 |
| 5,907,515 | 5/1999 | Hatakeyama ............ | 365/200 |

FOREIGN PATENT DOCUMENTS 0 675 501 A1  10/1995  European Pat. Off. .

OTHER PUBLICATIONS

International Publication No. WO 91/14227 (Owen et al.), dated Sep. 19, 1991.

"Flash Memories: the best or two worlds", 8045 IEEE Spectrum No. 12, Dec. 1989, pp. 30–33.

"Fuseless Non–Volatile Ferroelectric Redundant Word and Bit Decoder", vol. 34, No. 7B, Dec. 1991, pp. 138–140.

*Primary Examiner*—Son T. Dinh
*Assistant Examiner*—Anh Phung
*Attorney, Agent, or Firm*—Herbert L. Lerner; Laurence A. Greenberg; Werner H. Stemer

[57] ABSTRACT

A data memory has at least one memory location field with memory locations and a redundancy circuit that has at least one redundancy memory location is further provided. A redundancy selection line selector module that has at least one assignment memory in which an item of assignment information can be stored is also provided to the data memory. It being possible for at least one redundancy memory location to be assigned to at least one memory location on the basis of the assignment information. The assignment memory has an assignment memory location with a buffer for the purpose of holding the assignment information. In the known data memories, relatively long programming times are required when assigning redundancy memory locations to memory locations, depending on the programming method used. In the data memories according to the invention, the assignment information can be transferred from the buffer into the assignment memory location. As a result, redundancy memory locations can be assigned to defective memory locations quickly and with a low expenditure of energy.

12 Claims, 6 Drawing Sheets

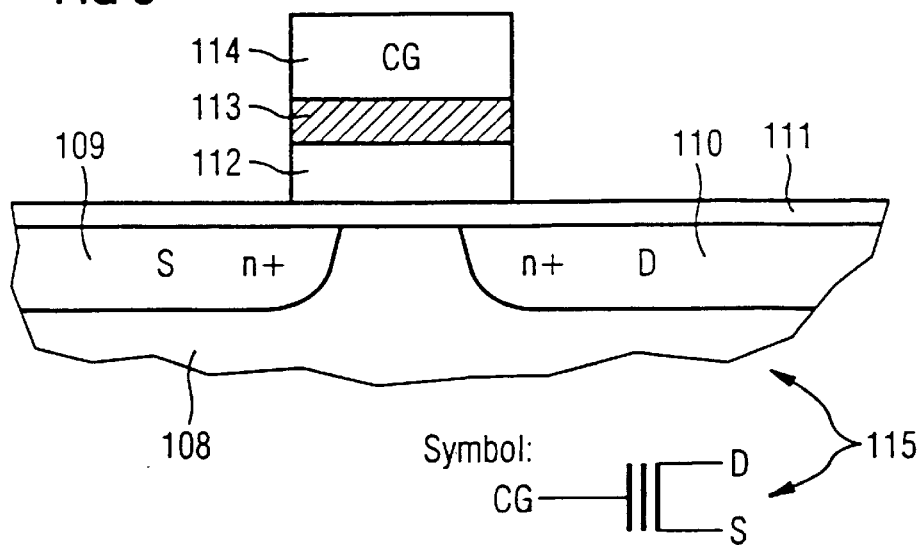
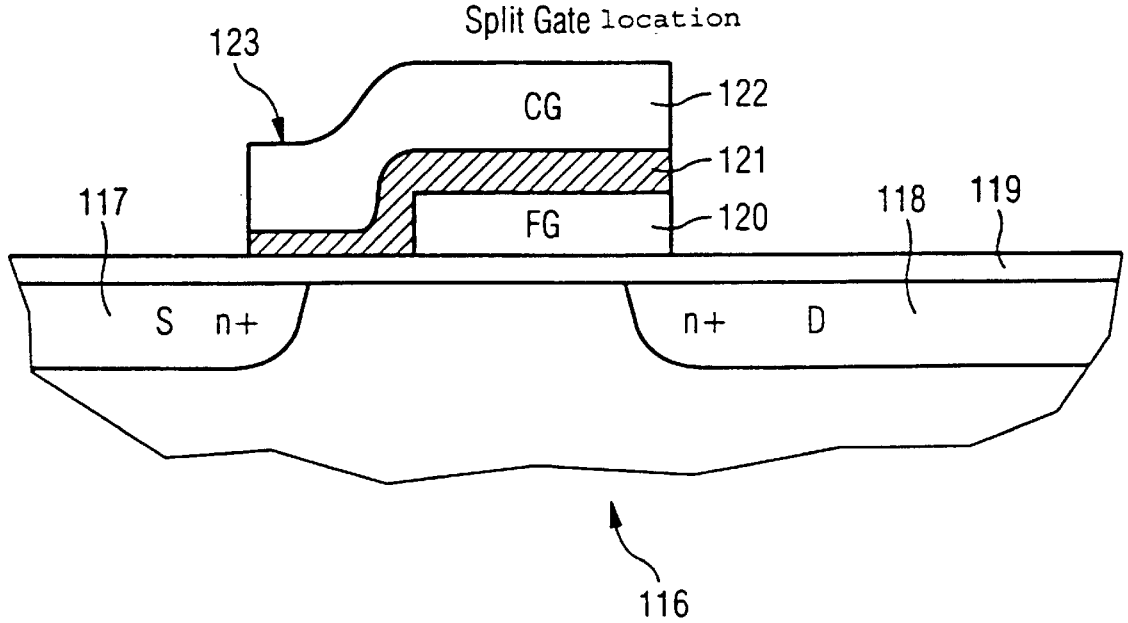

DATA MEMORY

CROSS REFERENCE TO RELATED APPLICATION

This application is a continuation of International Application PCT/DE98/00274, filed Jan. 30, 1998, which designated the United States.

BACKGROUND OF THE INVENTION

FIELD OF THE INVENTION

The invention relates to a data memory that has at least one memory location field with memory locations. It being possible to select the memory locations by applying at least one selection signal to selection lines provided in a region of the memory locations, the selection lines possibly including word lines and/or bit lines. The date memory further has a redundancy circuit that has at least one redundancy memory location. It being possible to select the redundancy memory locations by applying at least one redundancy selection signal to redundancy selection lines provided in a region of the redundancy memory locations, the redundancy selection lines possibly containing redundancy word lines and/or redundancy bit lines. A redundancy selection line selector module which has at least one assignment memory in which an item of assignment information can be stored is provided. The redundancy selection line selector module being configured such that it is possible on the basis of the assignment information for at least one redundancy selection line to be assigned to at least one selection line. The assignment memory further has an assignment memory location with a buffer for the purpose of holding the assignment information. The assignment memory is configured such that in one operating mode of the data memory the assignment information can be transferred from the assignment memory location into the buffer.

Data memories and, in particular, semiconductor data memories are frequently produced in the following way. Firstly, a multiplicity of data memories are produced on a substrate section, which is called a wafer. After the production of the wafer, the individual data memories are tested, specifically in particular as to whether the memory locations of the memory location field and the redundancy memory locations of the redundancy circuit operate properly. In this case, a respectively different value is repeatedly written into each memory location or into each redundancy memory location, it being checked by a subsequent read operation whether the checked memory location or redundancy memory location could be properly written. If a defective memory location is determined, the redundancy selection line selector module is programmed such that an unusable memory location is assigned a redundancy memory location operating properly. This is performed such that the assigned redundancy memory location takes over the function of the memory location detected as defective. On the basis of the particular configuration of the redundancy selection line selector module, an assigned redundancy memory location can be addressed such that the memory location field gives the impression from the outside of having only properly operating memory locations.

In a subsequent step, the wafer is sawed into individual data memories. Thereafter, the individual data memories are mounted in housings and subjected again to a test, the data memories of the generic type being handed over only thereafter.

The data memories of the generic type known from U.S. Pat. No. 5,200,922 have redundancy selection line selector modules which have static memory locations in order to store an item of assignment information on the basis of which during operation a redundancy memory location is assigned to a defective memory location. Relatively high voltages are required to program these memory locations, with the result that an additional outlay on circuitry is required in the case of the data memories of the generic type. Furthermore, depending on the programming method used, relatively long programming times are required when assigning redundancy memory locations to memory locations. This is particularly objectionable, because when testing the data memories of the generic type it is also necessary to check the redundancy memory locations for their proper functioning, and this is performed by repeatedly reprogramming the redundancy memory locations. The programming times add together in the case of a multiplicity of redundancy memory locations, with the result that the checking is particularly time consuming. The checking is also attended by a high power consumption. Furthermore, there are provided in the region of the assignment memories latches into which information is written from the assignment memories during operation of the data memory of the generic type. Overall, the data memories of the generic type are expensive to produce.

SUMMARY OF THE INVENTION

It is accordingly an object of the invention to provide a data memory which overcomes the above-mentioned disadvantages of the prior art devices of this general type, which has a simple structure in the case of which redundancy memory locations can be assigned to defective memory locations quickly, simply and with a low power consumption.

With the foregoing and other objects in view there is provided, in accordance with the invention, a data memory, including:

at least one memory location field having memory locations;

selection lines including at least one of word lines and bit lines connected to the memory locations, the memory locations being selected by applying at least one selection signal to the selection lines;

a redundancy circuit having at least one redundancy memory location;

redundancy selection lines including at least one of redundancy word lines and redundancy bit lines connected to the redundancy circuit, the at least one redundancy memory location being selected by applying at least one redundancy selection signal to the redundancy selection lines; and a redundancy selection line selector module having at least one assignment memory for storing an item of assignment information, the redundancy selection line selector module configured such that it is possible on a basis of the assignment information for at least one of the redundancy selection lines to be assigned to at least one of the selection lines, the at least one assignment memory having an assignment memory location with a buffer for holding the assignment information, the at least one assignment memory configured such that in one operating mode the assignment is information can be transferred from the assignment memory location into the buffer, the at least one assignment memory further configured such that it is possible in one programming mode for the assignment information to be transferred from the buffer into the assignment memory location.

The object is achieved according to the invention by virtue of the fact that the assignment memory is configured such that it is possible in one programming mode of the data memory for the assignment information to be transferred from the buffer into the assignment memory location.

It is provided in particular in this case that the information stored in the buffer or latch is a value which is prescribed from outside the data memory and, in response to a special signal, is transferred in a non-volatile fashion into the assignment memory location, which is a flash location or EEPROM location, for example. The result is a circuit which can be operated both in a state of "non-volatile shadow RAM" (NVM shadow RAM) and—given sole use of the latch—in a state of "conventional RAM". The pure RAM operation substantially facilitates the testing of the components of the data memory, while the NVM shadow mechanism acquires the settings even without external voltage. The configuration according to the invention produces the further advantage that only a single assignment memory location, which is, moreover, also particularly simple to program, is required per bit of the assignment memory.

In this case, it is provided in a further advantageous development of the invention that the non-volatile locations in the assignment memory can be programmed by a negative voltage at the control gate. As a result, the assignment memory is specifically particularly easy to implement inside a flash memory by a negative control gate programming voltage.

It is advantageous, furthermore, in this regard if the data memory is configured such that the assignment information stored in the assignment memory location is written into the latch when the data memory is activated for the first time, only the assignment information present in the latch being accessed in the following operation. Only a very low current is then required to operate the data memory according to the invention, because as a result a high power consumption occurs only once, specifically when reading out the assignment memory when turning on the data memory.

The preceding mode of procedure proves to be time saving for test purposes, since the quick reacting latch is used in the memory test and in assigning the redundancy memory locations to the memory locations, while the assignment information can be stored statically in the assignment memory location. Consequently, the redundancy assignment can also be quickly changed for test purposes, an assignment state found to be useful being written after the end of the test from the latch permanently into the assignment memory location. It is important, furthermore, that no high voltage is required, particularly when changing the latch state and this likewise reduces the outlay on circuitry.

If the assignment memory location and/or the selection circuit for the assignment memory location is configured such that it can be, in particular at the control gate, erased by a positive voltage and programmed by a negative voltage, or is so erased and programmed, it can be used particularly advantageously in a word line redundancy circuit in conjunction with flash data memories with a negative programming voltage.

It is advantageous for the assignment memory locations according to the invention to make use of flash memory locations that can be erased and programmed using Fowler-Nordheim tunnel currents. This is known, for example, in FLOTOX EEPROMs, and this technique is also applied for flash memories, in particular in 0.5 $\mu$m CMOS technology.

In advantageous developments, the assignment memory locations are configured in each case as a stacked gate location that can be produced favorably in terms of area. In the case of the configuration of the assignment memory location as a split gate location, the advantage arises of a particularly simple circuit which, however, prevents the production of leakage currents by process fluctuations in series-gate length in conjunction with extreme over-erase effects.

Furthermore, at least one address decoder is provided, which is connected between an address bus and the selection lines leading to the memory locations, the address decoder advantageously being configured such that one or more selection lines can be selected in accordance with an address present on the address bus. Moreover a redundancy address decoder is provided, which is connected between the address bus and the redundancy selection lines which lead to the redundancy memory locations. The redundancy address decoder being configured such that one or more redundancy selection lines can be selected in accordance with an address present on the address bus. Furthermore, the redundancy selection line selector module is preferably disposed in a region of the redundancy address decoder. The data memory configured as above turns out to be particularly advantageous, because the redundancy selection line selector module is easy to operate both in a programming state in which the redundancy memory locations are assigned to defective memory locations, and in an operating state, in which the corresponding redundancy memory locations replace the defective memory locations. Specifically, in the programming state the redundancy selection line selector module learns from the connected address bus the addresses of the memory locations respectively to be replaced via the same address lines via which the redundancy memory locations are accessed during operation. This substantially reduces the outlay on circuitry.

In a particularly advantageous fashion, the data memory according to the invention is configured with an address decoder that can be deactivated by the redundancy address decoder. This prevents defective readout of information, since in the case in which a redundancy memory location is accessed no memory location is accessed in any way. Furthermore, there is an increase in the reliability of the data memory.

Over and above this, it is particularly advantageous if the data memory has an address bus configured as a parallel address bus with a number of address bus lines and the assignment memory has assignment memory locations, the number of the assignment memory locations being equal to the number of the address bus lines.

The result of this is simple decoding of the address present on the address bus both in the programming mode and in the operating mode of the assignment memory of the data memory. In an advantageous fashion, a plurality of the assignment memories configured as above are immediately provided, each assignment memory then having at least one validation memory location with a validation address line. In this way, each redundancy selection line such as, for example, a redundancy word line is assigned precisely one assignment memory with a whole set of assignment memory locations and with a validation memory location, all of the assignment memories being connected in parallel with the address bus. As a result, each assignment memory receives the address instantaneously present on the address bus, it being possible for individual assignment memories to be assigned to specific addresses present on the address bus given suitable programming of the assignment memory locations. It can then be ensured by the suitable programming of the validation memory location that only the desired assignment memory responds to the addresses instantaneously present on the address bus.

The developments, explained above, of the data memory according to the invention prove to be advantageous above all in the case of normal operation of the data memory, in which the data memory is accessed. Particularly for the purpose of simple programming of the assignment memories of the data memory according to the invention, the latter has a redundancy selection line selector module with not only one, but a plurality of and, in particular, static assignment memories for the purpose of holding the assignment information. Assignment address lines are provided in the region of the assignment memory locations, it being possible to select at least one assignment memory by applying at least one assignment address signal to at least one assignment address line.

One of the several assignment memories can be easily selected during programming owing to the above development of the invention.

In this case, it is advantageous that at least one assignment memory selector decoder is provided which is connected between an assignment address bus and the assignment address lines and is configured such that one or more assignment address lines can be selected in accordance with an address present on the assignment address bus. The assignment memory selector module can be configured in this case as a sequential circuit that converts coded assignment memory addresses arriving on a parallel bus into signals present at individual assignment memories.

In the case of the subject matter of the invention configured as above, a single address bus ensures access to the memory location field and the redundancy memory locations, while by use of the assignment address bus those assignment memory locations are addressed which have to be programmed in order to assign the redundancy memory locations to the memory locations.

In an embodiment of the invention that is particularly easy to handle, the assignment memories are programmed by storing in each assignment memory the address of another memory location to be replaced. The assignment memory selector decoder being used to select which assignment memory takes over addressing for a specific memory location to be replaced. In this case, the selection signal, present on the address bus, for the memory location to be replaced is co-used directly as a programming signal for the assignment memory, it being ensured by appropriate interconnection that it is always only one assignment memory which is programmed with an address at the time. The advantage, essential to the invention, arises in this configuration that—signals of low strength present on the address bus already suffice to supply the assignment memory with the assignment information. In the prior art, this was not possible, but rather it was necessary to have high separately generated programming voltages for the purpose of programming the redundancy selection line selector module.

Other features which are considered as characteristic for the invention are set forth in the appended claims.

Although the invention is illustrated and described herein as embodied in a data memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a sectional view of the assignment memory location configured as a stacked gate location; and FIG. 9 is a sectional view of the assignment memory location configured as a split gate location.

DESCRIPTION OF THE PREFERRED EMBODIMENTS

Figure 1:
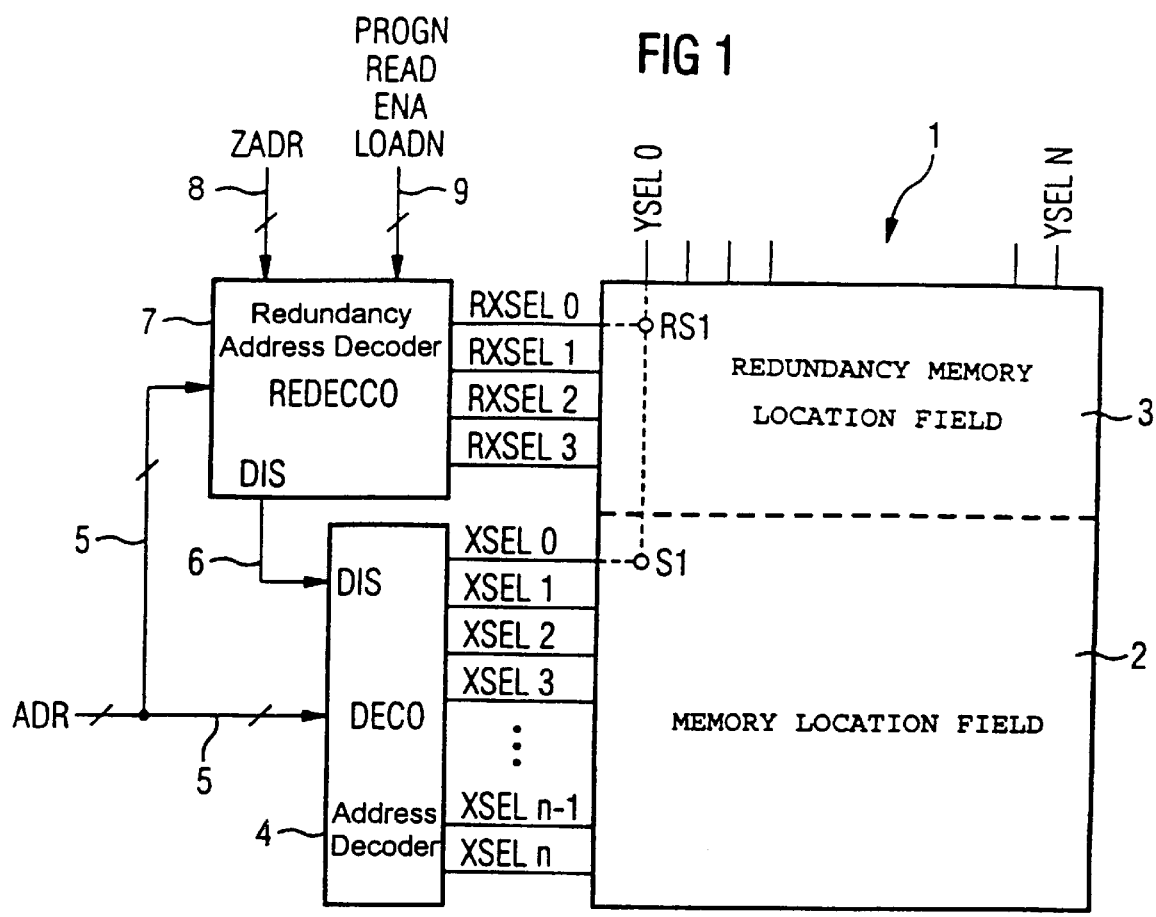
FIG. 1 is a diagrammatic, block diagram of a data memory according to the invention.

In all the figures of the drawing, sub-features and integral parts that correspond to one another bear the same reference symbol in each case. Referring now to the figures of the drawing in detail and first, particularly, to FIG. 1 thereof, is there is shown a data memory 1 according to the invention, which is produced on a semiconductor substrate (not shown in this view).

The data memory 1 has a memory location field 2 which can, for example, be a DRAM, an SRAM, an EEPROM, a flash or a FRAM. The memory location field 2 has word lines XSEL0 to XSELn, extending perpendicular to one another, as well as bit lines YSEL0 to YSELn. Individual memory locations in the memory location field 2 can be selected via the word lines and the bit lines by applying suitable selection signals. In this configuration, FIG. 1 shows only a single memory location S1 which is selected by selecting the word line XSEL0 and the bit line YSEL0. Selection circuits such as, for example, level converters associated with the memory location field are not shown in this view.

The data memory 1 further has a redundancy memory location field 3, which has redundancy word lines RXSEL0 to RXSEL3. Moreover, the redundancy memory location field 3 also uses the bit lines YSEL0 to YSELn of the memory location field 2. Redundancy memory locations of the redundancy memory location field 3 can be selected via the redundancy word lines RXSEL0 to RXSEL3 and the bit lines YSEL0 to YSELn. Only one redundancy memory location RS1 is represented in FIG. 1; it can be selected by applying suitable signals to the word line RXSEL0 and to the bit line YSEL0. Furthermore, the data memory 1 has an address decoder 4 for the word lines XSEL0 to XSELn of the memory location field 2. The address decoder 4 receives address data from a parallel address bus 5, which has a plurality of parallel address lines, and this is illustrated in the drawing by an oblique stroke applied to the address bus 5. The address decoder 4 converts the addresses present on the address bus 5 into selection signals for the word lines up to XSELn. The address decoder 4 is configured in the usual way for this purpose and will not be specially described here. The address decoder 4 also has a deactivation input 6. If a logic signal "1" is applied to the deactivation input 6, all the signals XSEL0 to XSELn are set to logic "0".

The data memory 1 further has a redundancy address decoder 7, which selects the redundancy word lines RXSEL0 to RXSEL3 as a function of its internal programming and of the address data arriving from the address bus 5. The redundancy address decoder 7 is connected to the deactivation input 6 of the address decoder 4, specifically in such a way that the address decoder can be deactivated by the redundancy address decoder 7. For its programming and its operation, the redundancy address decoder 7 has an assignment address bus 8 and various programming control signals, via which programming control signals PROGN, READ, ENA and LOADN can be input into the redundancy address decoder 7.

The redundancy circuit including the redundancy memory location field 3 and the redundancy address decoder 7 is provided in FIG. 1 by way of example for the word lines XSEL0 to XSELn. A redundancy circuit for the bit lines YSEL0 to YSELn can likewise be provided. Such a redundancy circuit for the bit lines is not shown in this view, because of the simplified representation.

Figure 2:
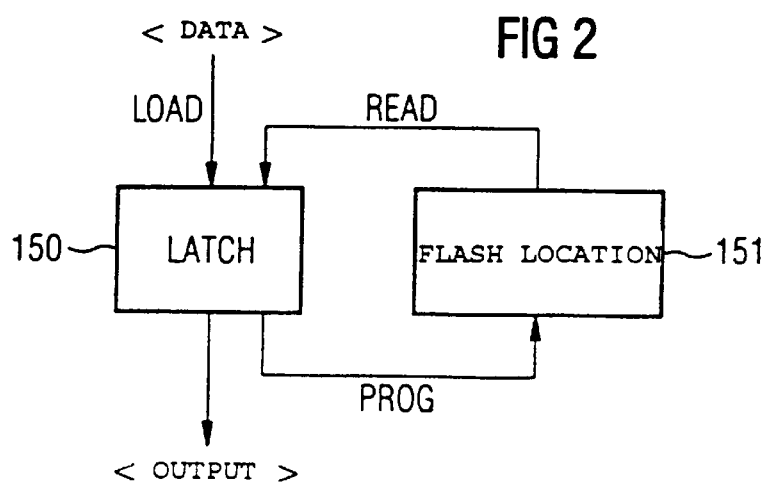
FIG. 2 is a simplified block diagram that illustrates a mode of operation of an assignment memory location together with a latch in the data memory.

FIG. 2 shows the basic principle of the operation of an assignment memory location according to the invention in a data memory, which location is configured here as a flash location 151, together with a buffer or latch 150. Selection data (that is to say data which specify that an assignment memory location has a specific state of "0" or "1") are loaded from the input bus <data> into the latch 150 by a signal LOAD.

An output of the latch 150 is part of a control of the redundancy decoder, the redundancy decoder having a number of "registers", composed of the flash location 151 and the latch 150, corresponding to the number of the redundancy selection lines and corresponding to the number of the lines of a data bus for accessing the data memory. The outputs of all the registers together represent the current state of the programming of the redundancy decoder. The information of the latch is programmed in a non-volatile fashion into the flash location by a signal PROG. This non-volatile information is transferred again into the latch by a signal READ, for example when the data memory is first supplied with power when being started up.

Figure 3:
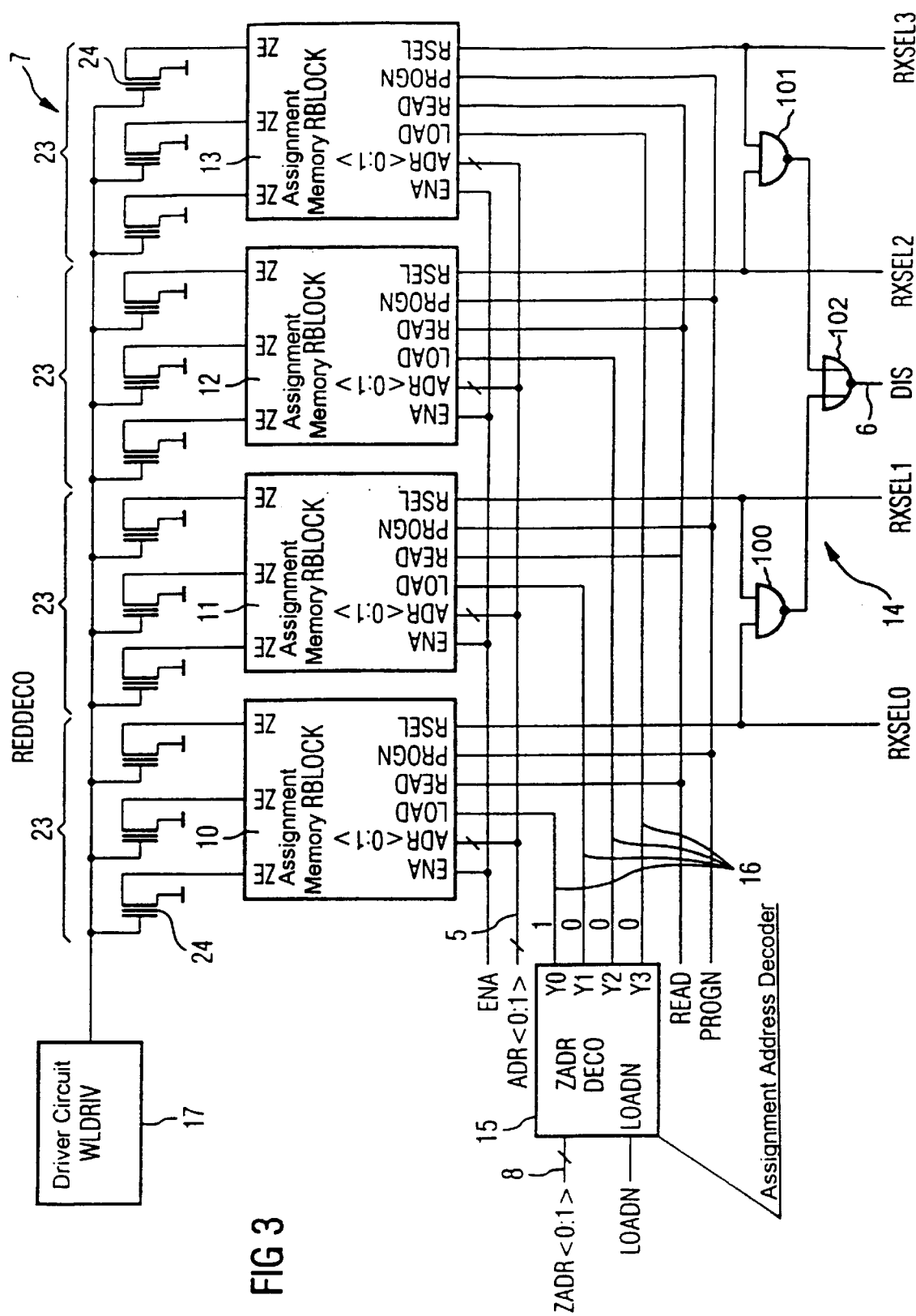
FIG. 3 is a block diagram of a redundancy address decoder of the data memory from FIG. 1.

FIG. 3 shows the redundancy address decoder 7 from FIG. 1 in more detail. Central components of the operating area of the redundancy address decoder 7 are four assignment memories 10, 11, 12 and 13, which are each connected on an output side to one of the redundancy word lines RXSEL0 to RXSEL3. On an input side, the assignment memories 10, 11, 12 and 13 are connected to the address bus 5. In addition, each of the assignment memories 10, 11, 12, 13 are connected to an activation line, which supplies a signal ENA.

A deactivation sequential circuit 14 is provided for generating a deactivation signal DIS for the deactivation input 6 of the address decoder 4. The deactivation sequential circuit 14 has two NAND gates 100, 101 with in each case two inputs, one NAND gate 100 being connected on the input side to the redundancy word lines RXSEL0 and RXSEL1, while the other NAND gate 101 is connected on the input side to the redundancy word lines RXSEL2 and RXSEL3. Outputs of the NAND gates 100, 101 are fed to two inputs of a NOR gate 102, which generates the signal DIS.

Together with the assignment memories 10, 11, 12 and 13 as well as with the deactivation sequential circuit 14, the address bus 5 forms the operating area of the redundancy address decoder 7 that is active in normal operation of the data memory 1. It is clear that a rising number of assignment memories must be provided in the redundancy address decoder 7 with a rising number of redundancy word lines RXSEL. However, only four redundancy word lines are provided in the exemplary embodiment of the invention.

The redundancy address decoder 7 also has a programming area, which is active exclusively in the programming mode of the data memory 1. For this purpose, the data memory 1 has an assignment address decoder 15, which is connected on an input side to an assignment address bus 8 and to the control line LOADN. Upon the input of a suitable assignment address signal on the assignment address bus 8, and of a signal LOADN, one of the four assignment memories 10, 11, 12 and 13 is activated for the programming operation. For this purpose, the assignment address decoder 15 has four output lines 16, which are denoted by Y0, Y1, Y2 and Y3 and which are fed to activation inputs LOAD of the assignment memories 10, 11, 12 and 13. Furthermore, the external programming control signals PROGN and ENA are fed to the assignment memories 10, 11, 12 and 13.

Furthermore, the assignment memories 10, 11, 12 and 13 each have three inputs ZE, which are supplied with a programming voltage via an actuable driver circuit 17 (WLDRIV) via in each case a selection group 23 composed of three flash locations 24, the gate operating voltages, in particular their polarity depend on the desired operating mode of the redundancy decoder 7. The operating voltages from the driver circuit 17 for affecting the input voltage ZE (control gates of the flash locations used as assignment memory locations) are as follows:

| Operating conditions | Programming | Erase | Rest | Read |
|---|---|---|---|---|
| $V_{CG}$ | −12 V (0V in the Deselected state) | 15 V | 0 V | 2.5 V |

The precise method of functioning of the drivers circuit 17 is not shown here.

Figure 4:
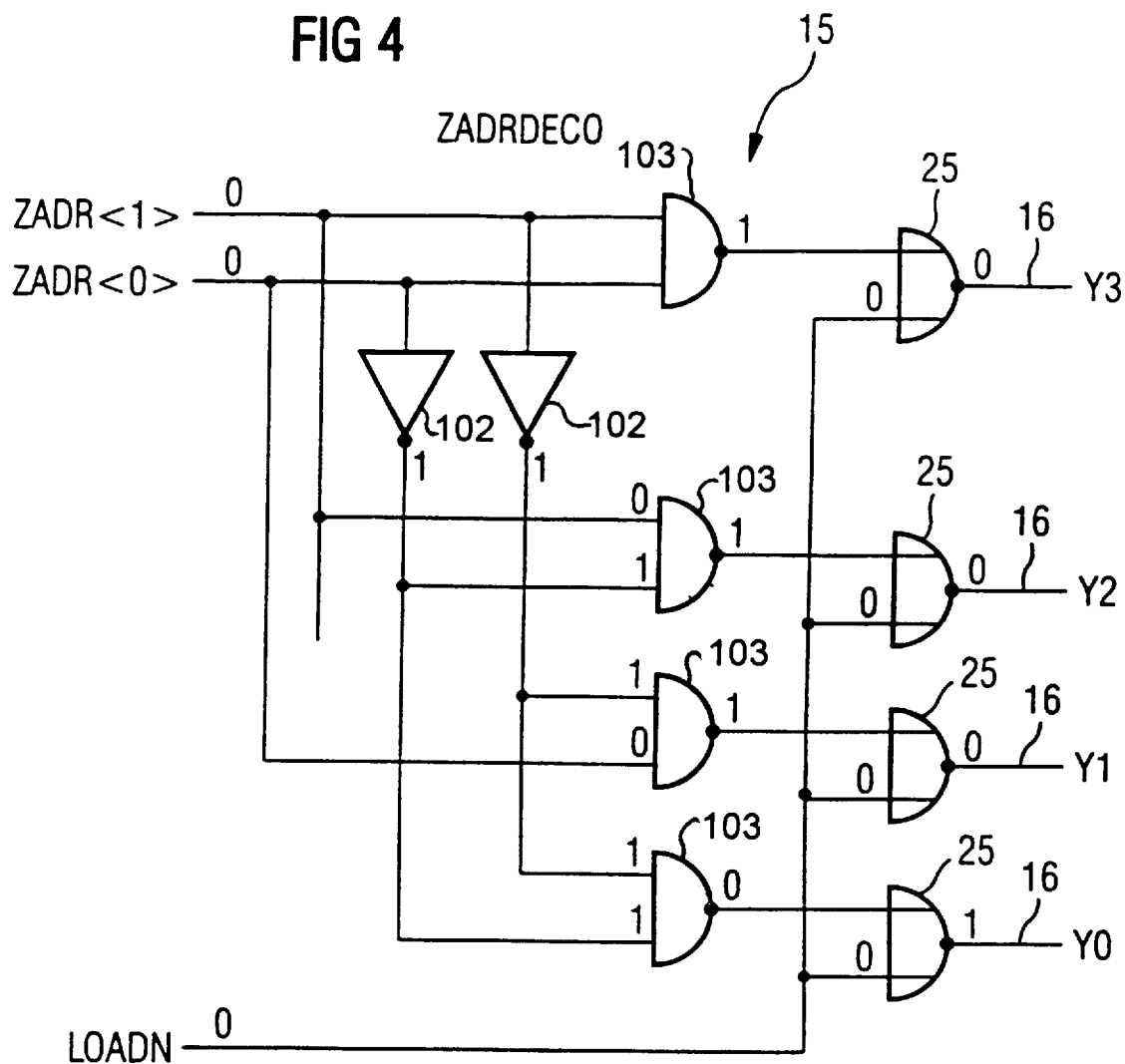
FIG. 4 is a circuit diagram of an assignment memory selector decoder from FIG. 3.

FIG. 4 shows the assignment address decoder 15 from FIG. 3 in more detail. As may be seen, the assignment address decoder 15 has four NAND gates 103 with in each case two inputs, which are interconnected with two inverters 104, as shown in FIG. 4, to form an assignment address decoder sequential circuit 18. As may be seen particularly well in this view, the assignment address bus 8 has only two assignment address lines ZADR0 and ZADR1. The signals for the four output lines 16 are generated from the two respectively binary coded assignment address lines of the assignment address bus 8, specifically by feeding one output of a NAND gate together with the external programming signal LOADN to in each case one NOR gate 25. One output each of the NOR gate 25 generates one of the signals for the output lines Y0, Y1, Y2 and Y3. As a result, as shown in FIG. 4, an assignment address signal "00", on the assignment address bus 8 is converted such that the logic level "1" is present on the output line Y0, while the logic level "0" is present in the case of the remaining output lines Y1, Y2 and Y3.

Figure 5:
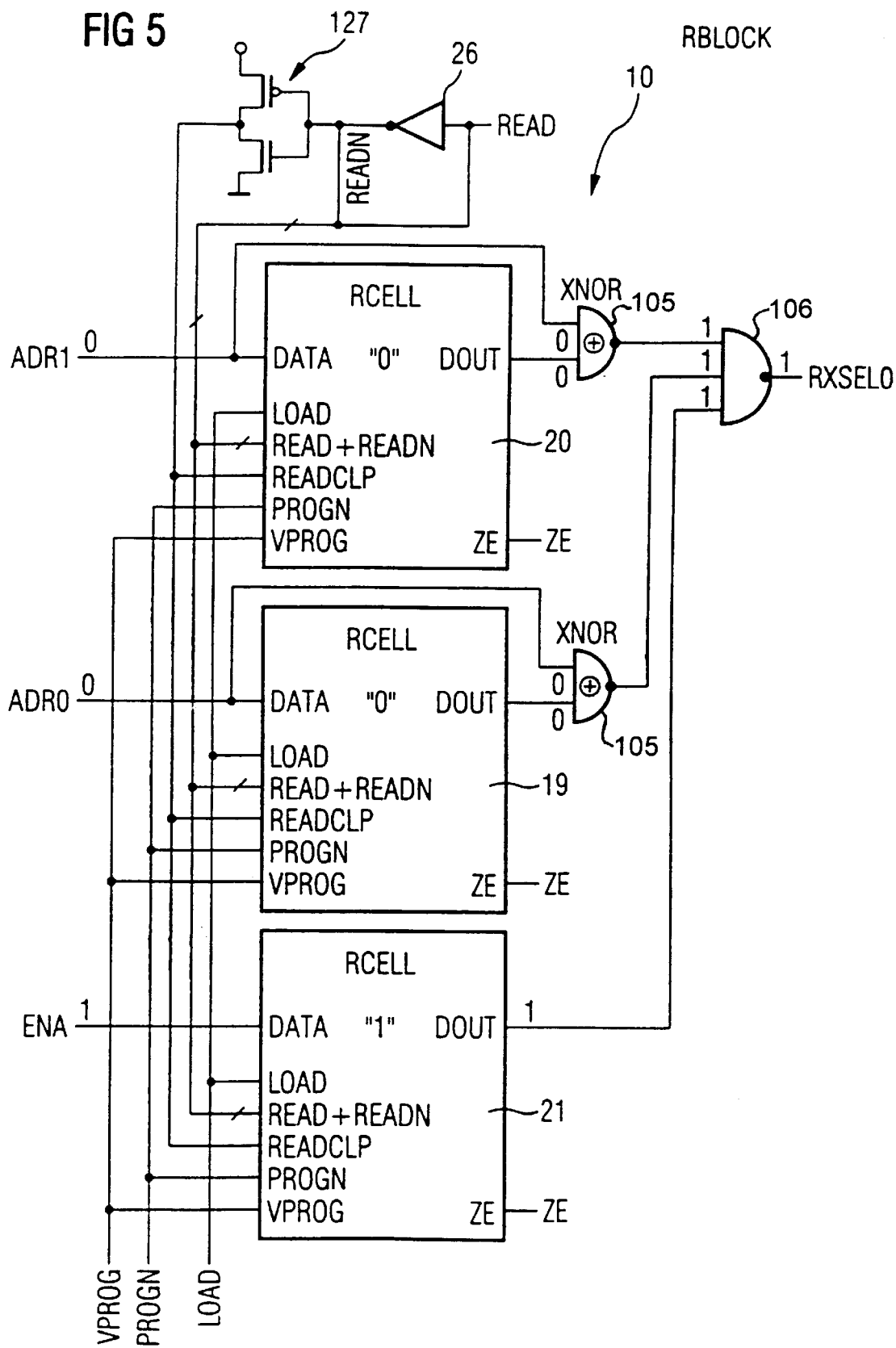
FIG. 5 is a block diagram of an assignment memory of the redundancy address decoder from FIG. 3.

FIG. 5 shows the assignment memory 10 from FIG. 3 in more detail. As may be seen particularly well in this view, the address bus 5, which is fed to the assignment memory 10 here contains only two address lines ADR0 and ADR1. Two assignment memory locations 19 and 20 are provided in the assignment memory 10 in accordance with the number of the individual lines of the address bus 5. In this configuration, the assignment memory location 19 is connected on an input side (terminal DATA) to the line ADR0 of the address bus 5, while the assignment memory location 20 is connected on an input side (terminal DATA) to the line ADR1 of the address bus 5. Rising numbers of assignment memory locations are necessary with a rising number of individual lines of the address bus 5, in order to ensure correct address decoding.

Furthermore, there is provided in the assignment memory 10 a validation memory location 21, which is connected on an input side (terminal DATA) to the programming line ENA already shown in FIG. 3.

Two outputs DOUT of the assignment memory location 19 and the assignment memory location 20 are fed in each case to an XNOR 105 gate with two inputs, in each case the other input of the XNOR gate being connected to the respective input terminal DATA of the assignment memory location. The outputs of the two XNOR gates 105 and the output DOUT of the validation memory location 21 are fed to an AND gate 106 with three inputs. The output of the AND gate 106 leads to the redundancy word line RXSEL0, as is best to be seen in FIG. 3. The assignment memory locations 19 and 20 as well as the validation memory location 21 are identically configured per se in each case. They have a first group of programming and control input lines VPROG, PROGN and LOAD, which are connected to corresponding programming and control lines to the assignment memory 10. Furthermore, a second group of programming inputs READ, READN and READCLP are provided at the assignment memory locations 19 and 20 as well as at the validation memory location 21, the corresponding programming signals READN and READCLP being generated from the external signal READ. For this purpose, the signal READ is firstly inverted via an inverter 26 to form the signal READN. The analog signal READCLP is then generated from the signal READN via a driver circuit 127 shown in FIG. 5. If READ is equal to the voltage Vdd (for example equal to 5V), it holds that READCLP=VCLP (for example, VCLP=1.2V).

With regard to the configuration of the assignment memory 10, it is further important that the assignment memory locations 19 and 20 as well as the validation memory location 21 are connected in parallel with respect to the programming inputs VPROG, PROGN, LOAD, READ, READN and READCLP.

Figure 6:
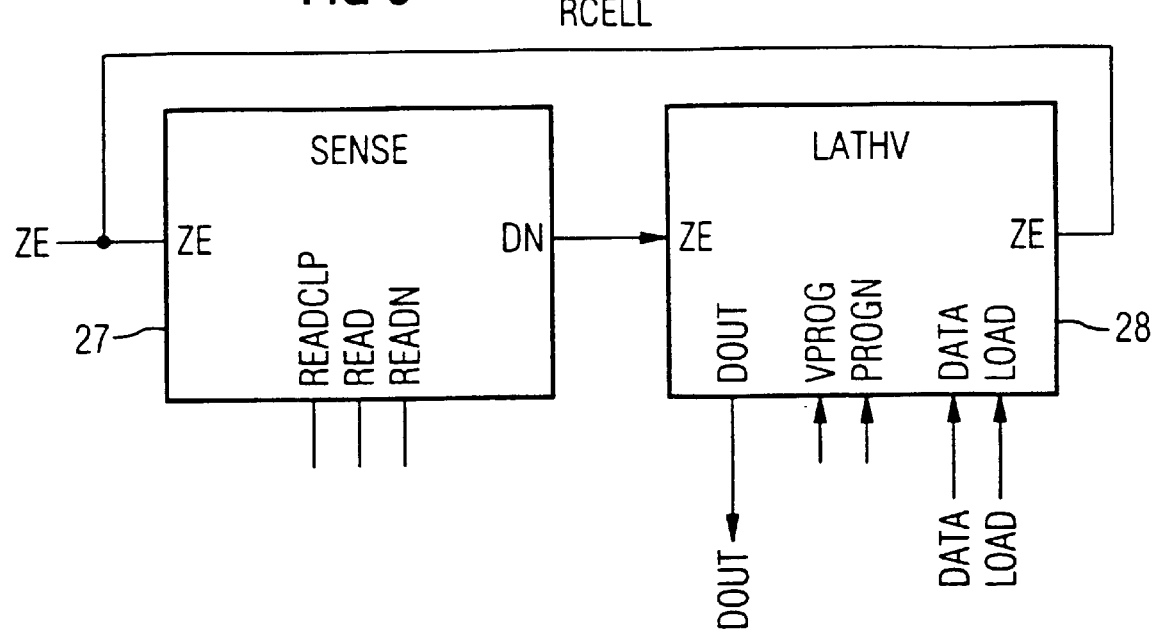
FIG. 6 is a block circuit diagram of an assignment memory location of the assignment memory from FIG. 5.

FIG. 6 shows the assignment memory location 19 from FIG. 5 in more detail. The assignment memory location 19 is divided into a read circuit 27 (SENSE) and a high-voltage latch circuit 28 (LATHV). In the case of LOAD being equal to logic "1", the value of DATA is transferred into the latch circuit 28 and appears at DOUT. With LOAD equal to logic "0", the value is held. LATHV has a second input DN, the value at this input being transferred in an inverted fashion into the latch circuit 28. Since this input does not have its own selection signal, the input must be connected in a high-resistance fashion in the idle state.

Figure 7:
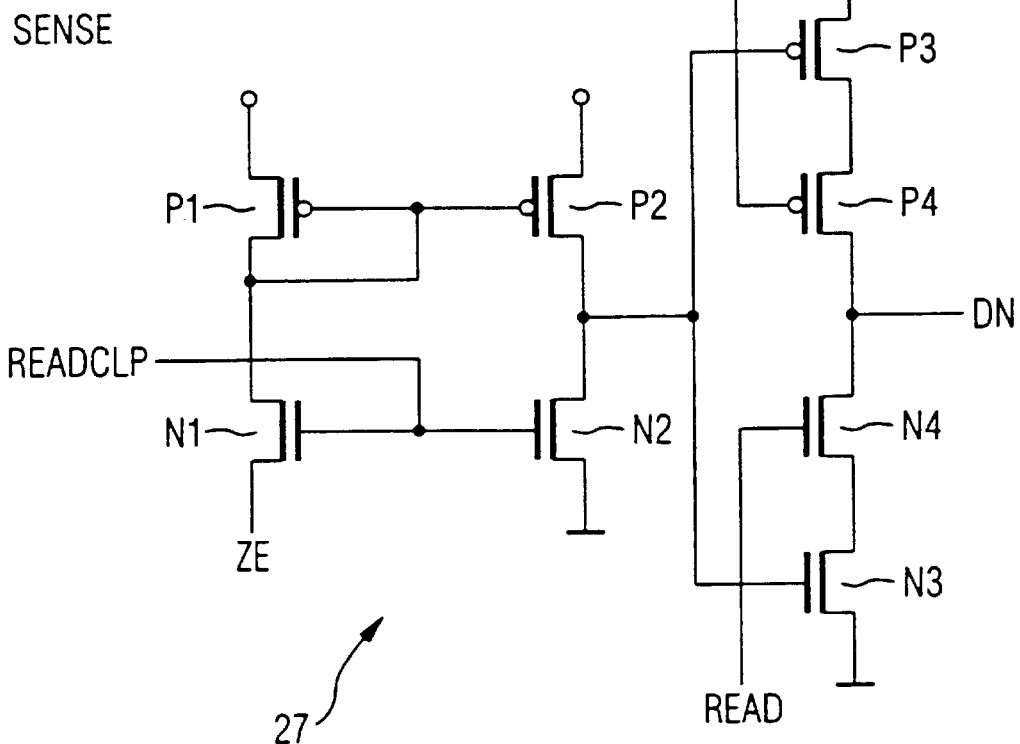
FIG. 7 is a circuit diagram of a sense circuit of the assignment memory location shown in FIG. 6.

FIG. 7 shows the read circuit 27 from FIG. 6 in more detail. In accordance with the requirements made of the latch circuit 28, the read circuit 27 has a tri-state output DN. In the case of READ equal to logic "0", this output is of high resistance. In the case of READ equal to logic "1", the detected value of the flash location (low Vt equal to logic "1" equal to 0V on the line ZE) is transferred into the latch circuit 28. In the programming mode (PROGN=0), the programming voltage at VPROG (for example 5V) or 0V is switched through to the outputs ZE, depending on the stored information. The control gate of the locations is held during programming to, for example −12V. The flash locations must be erased before each instance of programming by applying, for example, 15V at the control gate and 0V at ZE.

The signal present at ZE is mirrored via N1 to P1 and P2 and, if appropriate amplified. The current switching point of the circuit is set in this case by dimensioning N1, P1, P2 and N2. The output DN can assume a high-resistance state by setting READ=0V and READN=Vdd.

FIG. 8 shows a memory location, configured as a stacked gate location 115, of an assignment memory according to the invention. A source 109 and a drain 110 are introduced into a substrate 108 by doping. Located on the substrate is a tunnel oxide layer 111 to which a floating-gate layer 112 is applied. An inter-poly-dielectric 113 is applied to the floating-gate layer 112. Finally, a control-gate layer 114 is also applied to an inter-poly-dielectric 113, and this is also connected exclusively to the inter-poly-dielectric. The symbolic designation of the stacked gate location 115 is specified below the presentation in FIG. 8.

FIG. 9 shows a memory location, configured as a split gate location 116, of a data memory according to the invention. A source 117 and a drain 118 are introduced into a semiconductor substrate by doping. Located on the substrate is a tunnel oxide layer 119 and a floating-gate region 120. An inter-poly-dielectric 121 is applied to the floating-gate region 120, specifically in such a way that a region of the inter-poly-dielectric 121 extends downwards from the top side of the floating gate 120 to the tunnel oxide layer 119. Located on the inter-poly-dielectric 121 is the control gate 122, the region extending from the region above the inter-poly-dielectric 121 into the region of the tunnel oxide layer 119 being configured as a series gate 123.

In operation, the data memory 1 according to the invention performs as described below with the aid of FIGS. 1 to 7. It is assumed for this purpose that after the production of the data memory 1 it has been established in a test procedure that the memory location Si is defective, and that the redundancy memory location RS1 established as operating correctly is to take over the function of said memory location.

When the data memory 1 is programmed in such a way that the function of the memory location S1 is taken over by the redundancy memory location RS1, for this purpose, a word line address "00" which is selected by the word line XSEL0 is applied to the address bus 1. For this purpose, the value logic "00" is generated on the two selection lines ADR0 and ADR1 of the address bus 5 (compare FIG. 5).

Since the assignment memory 10 undertakes the assignment of the redundancy memory location RS1, the latter must firstly be selected for its programming 10. This is performed by applying to the assignment address bus 8 an assignment address "00", which selects the assignment memory 10 via the output line Y0 (compare FIG. 3 and FIG. 4). As is shown in FIG. 4, this is performed by applying the logic address "00" to assignment address lines ZADR0 and ZADR1. Thereupon, a state of logic "1" appears on the output line Y0, while the remaining output lines Y1, Y2 and Y3 are respectively at the logic level of "0". By applying LOADN="0", the RAM locations in the assignment memory location 19 are occupied with the values present on the lines ADR0 and ADR1.

Before the programming of the non-volatile part, the flash locations in the assignment memory 10 are erased by applying 15V to the control gate and 0V to ZE (compare FIGS. 6 and 7). Furthermore, the lines PROGN (FIG. 5) must still be set to "0", and an appropriate programming voltage must be applied to VPROG (compare description relating to FIGS. 6 and 7). In this way, the values of logic "0" are written into the non-volatile part of the assignment memory location 19 and the assignment memory location 20, specifically in accordance with the logic values present on the selection lines ADR0 and ADR1.

Furthermore, the input line ENA (compare FIG. 3 and FIG. 5) are brought to the state of logic "1". The value of logic "1", is likewise located in the validation memory location 21 after the programming and in accordance with the value of logic "1" present on the input line ENA. As a result, after the programming the redundancy memory location RS1 is assigned to the memory location S1. In operation, the data memory 1 programmed as above performs as described below. It is assumed for this purpose that during operation of the data memory 1 an attempt is to be made to access the memory location S1. For this purpose, the item of address data logic "00" is applied to the selection lines ADR0 and ADR1 of the address bus 5 (compare FIG. 5). The programming lines ENA, READ, READN, VPROG and PROGN perform no sort of function during operation of the data memory 1 after its initialization, and they are held deactivated.

The value of logic "0" is then respectively present at the two inputs of the XNOR gates shown in FIG. 5, specifically on the one hand on the basis of the value of logic "0" supplied by the selection lines ADR0 and ADR1, and on the basis of the value of logic "0" supplied by the assignment memory locations 19 and 20 and stored during the programming. The outputs of the XNOR gates 105 in FIG. 5 thereupon generate the value of logic "1", which is fed to the AND gate 106 in FIG. 5. Because of the programming, the value of logic "1", which is likewise fed to the AND gate with three inputs in FIG. 5, is located in the validation memory location 21. Thus, the output of the AND gate 106 with three inputs in FIG. 5 goes over to logic "1", and this selects the redundancy word line RXSEL0 (compare FIG. 3). In this way, the word line RXSEL0 belonging to the redundancy memory location RS1 is selected when the address indicating the memory location S1 is present on the address bus 5. Since the outputs RSEL of the assignment memories 11, 12 and 13 (compare FIG. 3) are at the state of 0, while the output RSEL of the assignment memory 10 has the value of logic "1", the output DIS of the deactivation sequential circuit 14 in FIG. 3 assumes a value of logic "1". The address decoder 4 (compare FIG. 1) is thereby deactivated, with the result that interactions between the output of the memory location S1 and the output of the redundancy memory location RS1 are prevented.

What is claimed is:

1. A data memory, comprising:
    at least one memory location field having memory locations;
    selection lines including at least one of word lines and bit lines connected to said memory locations, said memory locations being selected by applying at least one selection signal to said selection lines;
    a redundancy circuit having at least one redundancy memory location;
    redundancy selection lines including at least one of redundancy word lines and redundancy bit lines connected to said redundancy circuit, said at least one redundancy memory location being selected by applying at least one redundancy selection signal to said redundancy selection lines; and
    a redundancy address decoder having at least one assignment memory for storing an item of assignment information, said redundancy address decoder configured such that it is possible on a basis of the assignment information for at least one of said redundancy selection lines to be assigned to at least one of said selection lines, said at least one assignment memory having an assignment memory location with a buffer for holding the assignment information, said at least one assignment memory configured such that in one operating mode the assignment information can be transferred from said assignment memory location into said buffer, said at least one assignment memory further configured such that it is possible in one programming mode for the assignment information to be transferred from said buffer into said assignment memory location.

2. The data memory according to claim 1, wherein said assignment memory location is a plurality of assignment memory locations configured such that they can be erased by a positive voltage and can be programmed by a negative voltage.

3. The data memory according to claim 2, wherein said plurality of assignment memory locations include flash memory locations with control gates and can be erased by the positive voltage applied at said control gates and can be programmed by the negative voltage applied at said control gates.

4. The data memory according to claim 1, wherein said assignment memory location is a plurality of assignment memory locations that are configured such that they can be erased and can be programmed in each case using Fowler-Nordheim tunnel currents.

5. The data memory according to claim 1, wherein said assignment memory location is a plurality of assignment memory locations configured in each case as a stacked gate location.

6. The data memory according to claim 1, wherein said assignment memory location is a plurality of assignment memory locations configured in each case as a split gate location.

7. The data memory according to claim 1, including:
    an address bus;
    at least one address decoder connected between said address bus and said selection lines, said at least one address decoder is configured such that at least one of said selection lines can be selected in accordance with an address present on said address bus; and
    said redundancy address decoder connected between said address bus and said redundancy selection lines, said redundancy address decoder configured such that at least one of said redundancy selection lines can be selected in accordance with the address present on said address bus.

8. The data memory according to claim 7, wherein said at least one address decoder can be deactivated by said redundancy address decoder.

9. The data memory according to claim 7, wherein:
    said address bus is a parallel bus with a number of address bus lines; and
    said assignment memory location is a plurality of assignment memory locations of said at least one assignment memory, a number of said plurality of assignment memory locations being equal to said number of said address bus lines.

10. The data memory according to claim 9, wherein said at least one assignment memory has at least one validation memory location with a validation address line.

11. The data memory according to claim 1, wherein said at least one assignment memory is a plurality of assignment memories of said redundancy address decoder for holding the assignment information, and including assignment address lines connected to said plurality of assignment memories, at least one of said plurality of assignment memories selected by applying at least one assignment signal to at least one of said assignment address lines.

12. The data memory according to claim 6, including:

assignment address lines, said at least one assignment memory is a plurality of assignment memories connected to said assignment address lines;

an assignment address bus; and at least one assignment address decoder connected between said assignment address bus and said assignment address lines, said at least one assignment address decoder configured such that at least one of said assignment address lines can be selected in accordance with an address present on said assignment address bus.

* * * * *